(12) United States Patent
Ko et al.

(10) Patent No.: US 7,635,524 B2
(45) Date of Patent: Dec. 22, 2009

(54) COATING COMPOSITION FOR DIELECTRIC INSULATING FILM, DIELECTRIC INSULATING FILM PREPARED THEREFROM, AND ELECTRIC OR ELECTRONIC DEVICE COMPRISING THE SAME

(75) Inventors: Min-Jin Ko, Daejeon (KR); Ki-Youl Lee, Dejeon (KR); Bum-Gyu Choi, Daejeon (KR); Myung-Sun Moon, Daejeon (KR); Dae-Ho Kang, Daejeon (KR); Jeong-Man Son, Gyeongju (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 12/222,120

(22) Filed: Aug. 1, 2008

(65) Prior Publication Data

US 2008/0293879 A1 Nov. 27, 2008

Related U.S. Application Data

(62) Division of application No. 11/270,830, filed on Nov. 10, 2005, now abandoned.

(30) Foreign Application Priority Data

Mar. 16, 2005 (KR) .................. 10-2005-0021977

(51) Int. Cl.
*B32B 27/18* (2006.01)
*B32B 27/28* (2006.01)
*C08L 83/04* (2006.01)
*C08G 77/04* (2006.01)

(52) U.S. Cl. .................. 428/447; 524/588; 528/10

(58) Field of Classification Search .................. 528/35; 524/443

See application file for complete search history.

(56) References Cited

U.S. PATENT DOCUMENTS

| 4,611,040 | A | * | 9/1986 | Olson et al. .................. 526/279 |
| 5,468,285 | A | * | 11/1995 | Kennerknecht ............ 106/38.3 |
| 5,512,650 | A | * | 4/1996 | Leir et al. ...................... 528/14 |
| 6,617,264 | B1 | * | 9/2003 | Hsiao et al. .................. 438/780 |
| 2006/0141163 | A1 | * | 6/2006 | Choi et al. .................. 427/384 |

FOREIGN PATENT DOCUMENTS

| JP | 2002-003783 | 1/2002 |
| JP | 2002-003784 | 1/2002 |
| JP | 2002-026003 | 1/2002 |
| JP | 2002-348542 | 12/2002 |
| JP | 2003-115485 | 4/2003 |
| JP | 2005-023318 | 1/2005 |
| JP | 2005-036228 | 2/2005 |
| KR | 1020040087888 A | 10/2004 |
| WO | WO 95/03354 | 2/1995 |
| WO | WO 2004/090058 | 10/2004 |
| WO | WO 2006/098544 A1 | 9/2006 |

* cited by examiner

*Primary Examiner*—Randy Gulakowski
*Assistant Examiner*—Robert Loewe
(74) *Attorney, Agent, or Firm*—McKenna Long & Aldridge LLP

(57) ABSTRACT

The present invention relates to a coating composition for a dielectric insulating film comprising a) an organosiloxane polymer, b) first metal ions selected from the group consisting of Rb ions, Cs ions, and a mixture thereof, and c) an organic solvent, in which the first metal ions are comprised at 1 to 200 ppm based on the weight of the composition, a dielectric insulating film prepared therefrom, and an electric or electronic device comprising the same.

A dielectric insulating film prepared from the coating composition of the present invention has an improved dielectric constant and superior mechanical strength and electric properties.

10 Claims, No Drawings

COATING COMPOSITION FOR DIELECTRIC INSULATING FILM, DIELECTRIC INSULATING FILM PREPARED THEREFROM, AND ELECTRIC OR ELECTRONIC DEVICE COMPRISING THE SAME

CROSS REFERENCES TO RELATED APPLICATION

This application is a Divisional of application Ser. No. 11/270,830 filed Nov. 10, 2005 now abandoned, which claims priority to and the benefit of Korean Patent Application No. 10-2005-0021977 filed in the Korean Industrial Property Office on Mar. 16, 2005, the entire contents of both are incorporated hereinto by reference.

FIELD OF THE INVENTION

The present invention relates to a coating composition for a dielectric insulating film, a dielectric insulating film prepared therefrom, and an electric or electronic device comprising the same, and more particularly to a coating composition for a dielectric insulating film having superior mechanical strength and electric properties while having a low dielectric constant, a dielectric insulating film prepared therefrom, and an electric or electronic device comprising the same.

BACKGROUND OF THE INVENTION

As semiconductor devices become more integrated, and consequently the metal wiring pitches decrease, such problems as propagation delay, crosstalk noise, and power dissipation are causing concern.

To solve these problems, reducing the RC delay can initially be considered. For this purpose, resistance of the metal wiring material and conductance between each metal wire are reduced. In general, use of copper (Cu) which has good electric conductivity as a metal wiring material and a highly insulating material between the metal wires are known to be good for the purpose.

Most currently used insulating are $SiO_2$ based materials, having a dielectric constant of 4.0. Recently, materials having a dielectric constant of 3.0 have become commercially available. Efforts are being made to reduce the constant to below 2.2 or 2.0 in the long term.

As conventional ways of reducing the dielectric constant to or below 2.5, there are a method of introducing a pore generating material into a low-dielectric matrix resin, curing it, and removing the material to obtain a porous dielectric insulating film, a method of hydrolyzing a silane compound in the presence of a base catalyst and polymerizing it to obtain a porous film, and so forth. Although low-dielectric insulating films obtained by these methods have a dielectric constant of 2.5 or less, mechanical strength decreases significantly and electric properties worsen because of the presence of pores. Thus, improvement of physical properties is required for semiconductors.

Besides having good dielectric and mechanical properties, a coating composition for a dielectric insulating film used in a semiconductor device should have particulate or metallic impurities below a given level. If particles or metal ions are present in the dielectric insulating film composition, productivity may decrease.

Also, if metals such as Na, K, Ca, Fe, Cu, Ni, Mg, and Zn or their ions are present in the dielectric insulating film composition, electric properties of the resultant dielectric insulating film may be poor. Especially, such metal ions as $Na^+$ and $K^+$ should be controlled to below a given level, because they diffuse fast and may cause a fatal effect on the performance of the gate device.

SUMMARY OF THE INVENTION

The present invention was made in consideration of the above-mentioned problems, and it is an object of the invention to provide a coating composition for a dielectric insulating film comprising specific metal ions and thus offering a low dielectric constant and superior mechanical strength and electric properties to a dielectric insulating film.

It is another object of the invention to provide a dielectric insulating film prepared from the dielectric insulating film composition and which thus has a low dielectric constant and superior mechanical strength and electric properties.

It is still another object of the invention to provide an electric or electronic device comprising the dielectric insulating film.

In order to attain the objects, the present invention provides a coating composition for a dielectric insulating film comprising a) an organosiloxane polymer; b) a first metal ions selected from the group consisting of Rb ions, Cs ions, and a mixture thereof; and c) an organic solvent, where the first metal ions are comprised at 1 to 200 ppm based on the weight of the composition.

The invention also provides a dielectric insulating film prepared from the coating composition for a dielectric insulating film and comprising metal ions selected from the group consisting of Rb ions, Cs ions, and a mixture thereof.

The invention further provides an electric or electronic device comprising the dielectric insulating film.

DETAILED DESCRIPTION OF THE PREFERRED EMBODIMENTS

Hereunder is given a detailed description of the present invention.

The present inventors worked on a dielectric insulating film having a low dielectric constant and superior mechanical and electric properties while containing fewer metals, such as Na, K, Ca, Fe, Cu, Ni, Mg, and Zn, and ions thereof. In doing so, they found that a coating composition for a dielectric insulating film including a specific amount of Rb ions, Cs ions, or a mixture thereof facilitates curing of the dielectric insulating film and increases cross-linkage density of the dielectric insulating film, thereby improving the mechanical strength, dielectric property, electric properties, etc., of the dielectric insulating film.

In this specification, Rb ions, Cs ions, or a mixture thereof is referred to as the first metal ions, and the other metal ions excluding the Rb ions or the Cs ions, such as Na, K, Ca, Fe, Cu, Ni, Mg, or Zn ions, is referred to as the second metal ions.

In general, in the manufacturing process of semiconductor devices, the second metal ions may be included above a certain level when making copper wiring and during barrier film processing and dielectric insulating film manufacturing. Also, it may be included above a certain level when manufacturing the coating composition for a dielectric insulating film because of the organosiloxane polymer source, solvent, reactor, and so forth.

If a coating composition containing the second metal ions is prepared into a dielectric insulating film, the electric properties of the dielectric insulating film may be not good. In particular, the $Na^+$ ions and the $K^+$ ions may cause a fatal effect on the gate device characteristics because of a very fast diffusion rate. Thus, their content is strictly limited in semiconductor manufacturing processes.

However, if a coating composition not containing the second metal ions is prepared into a dielectric insulating film, the dielectric property, mechanical strength, and electric properties become poor.

The coating composition for a dielectric insulating film in accordance with the present invention comprises a) an organosiloxane polymer, b) first metal ions selected from the group consisting of Rb ions, Cs ions, and a mixture thereof, and c) an organic solvent.

The organosiloxane polymer may be any one polymerized from a silane compound or a silane oligomer, however an organosiloxane polymer polymerized from at least one silane compound selected from the group consisting of a) at least one monomer selected from the group consisting of the compounds represented by Formula 1 and Formula 2 below, b) a dimer prepared from the monomer, and c) an oligomer prepared from the monomer, the dimer, or a mixture thereof, is more preferable in terms of dielectric property and mechanical strength.

$$SiR^1_p R^2_{4-p} \quad (1)$$

where $R^1$ is hydrogen, an aryl, a vinyl, an allyl, a $C_1$-$C_4$ linear or branched alkyl substituted with fluorine, or a $C_1$-$C_4$ linear or branched alkyl not substituted with fluorine;

$R^2$ is a $C_1$-$C_4$ linear or branched alkoxy, acetoxy, or chlorine; and p is an integer of 1 or 2,

$$R^3_q R^4_{3-q}Si\text{-}M\text{-}SiR^5_r R^6_{3-r} \quad (2)$$

where each of $R^3$ and $R^5$ is, independently, hydrogen, fluorine, an aryl, a vinyl, an allyl, a $C_1$-$C_4$ linear or branched alkyl substituted with fluorine, or a $C_1$-$C_4$ linear or branched alkyl not substituted with fluorine;

each of $R^4$ and $R^6$ is, independently, a $C_1$-$C_4$ linear or branched alkoxy, an acetoxy, or chlorine;

M is a $C_1$-$C_6$ alkylene, or a phenylene; and each of q and r is an integer of 0 to 2.

The organosiloxane polymer preferably has a weight-average molecular weight, in terms of equivalent polystyrene molecular weight, of at least 500, and is preferably in the range of 500 to 1,000,000. If the weight-average molecular weight of the organosiloxane polymer is less than 500, the coating property of the dielectric insulating film may worsen.

The organosiloxane polymer may be prepared by mixing a silane compound polymerized from at least one selected from the group consisting of i) at least one monomer selected from the group consisting of the compounds represented by Formula 1 and Formula 2, ii) a dimer prepared from the monomer, and iii) an oligomer prepared from the monomer, the dimer, or a mixture thereof with a catalyst and water, and then hydrolyzing and condensing the silane compound.

The hydrolysis and condensation may proceed by adding an organic solvent, if necessary. Preferably, the hydrolysis and condensation are performed in the presence of an organic solvent for convenience of molecular weight control of the organosiloxane polymer to be polymerized.

In the preparation of the organosiloxane polymer, any organic solvent that does not affect the hydrolysis or condensation of the silane compound may be used, however, at least one selected from the group consisting of an aliphatic hydrocarbon solvent, an aromatic hydrocarbon solvent, an alcohol solvent, a ketone solvent, an ether solvent, an ester solvent, and an amide solvent is preferable.

To be specific, at least one organic solvent selected from the group consisting of a) at least one aliphatic hydrocarbon solvent selected from the group consisting of n-pentane, i-pentane, n-hexane, i-hexane, 2,2,4-trimethylpentane, cyclohexane, and methylcyclohexane, b) at least one aromatic hydrocarbon solvent selected from the group consisting of benzene, toluene, xylene, trimethylbenzene, ethylbenzene, and methylethylbenzene, c) at least one alcohol solvent selected from the group consisting of methyl alcohol, ethyl alcohol, n-propanol, i-propanol, n-butanol, i-butanol, sec-butanol, t-butanol, 4-methyl-2-pentanol, cyclohexanol, methylcyclohexanol, and glycerol, d) at least one ketone solvent selected from the group consisting of methylethylketone, methylisobutylketone, diethylketone, methyl n-propylketone, methyl n-butylketone, cyclohexanone, methylcyclohexanone, and acetylacetone, e) at least one ether solvent selected from the group consisting of tetrahydrofuran, 2-methyltetrahydrofuran, ethyl ether, n-propylether, isopropylether, diglyme, dioxin, dimethyldioxin, ethylene glycol monomethyl ether, ethylene glycol dimethyl ether, ethylene glycol diethyl ether, propylene glycol monomethyl ether, and propylene glycol dimethyl ether, f) at least one ester solvent selected from the group consisting of diethyl carbonate, methyl acetate, ethyl acetate, ethyl lactate, ethylene glycol monomethyl ether acetate, propylene glycol monomethyl ether acetate, and ethylene glycol diacetate, and g) at least one amide solvent selected from the group consisting of N-methylpyrrolidone, formamide, N-methylformamide, N-ethylformamide, N,N-dimethylacetamide, and N,N-diethylacetamide is preferable.

The catalyst used in the hydrolysis and condensation may be an acid catalyst or a base catalyst. In general, an acid catalyst is preferable when an organic molecule or an organic polymer is processed.

The acid catalyst is not particularly limited, but at least one selected from the group consisting of hydrochloric acid, nitric acid, sulfuric acid, phosphoric acid, fluoric acid, formic acid, acetic acid, propionic acid, butanoic acid, pentanoic acid, hexanoic acid, monochloroacetic acid, dichloroacetic acid, trichloroacetic acid, trifluoroacetic acid, oxalic acid, malonic acid, sulfonic acid, phthalic acid, fumaric acid, citric acid, maleic acid, oleic acid, methylmalonic acid, adipic acid, p-aminobenzoic acid, and p-toluenesulfonic acid is preferable.

The base catalyst is also not particularly limited, but at least one selected from the group consisting of an alkali metal compound, ammonia water, an organic amine, and a quaternary ammonium compound is preferable.

The addition amount of the catalyst is not particularly limited, but is determined depending on the kind of the catalyst and the silane compound.

The water used along with the catalyst is added to hydrolyze the silane compound. Preferably, the water is used at 1 to 30 moles, more preferably at 2 to 20 moles, per 1 mole of hydrolysable functional groups of the silane compound. If the water content is below 1 mole per mole of hydrolysable functional groups of the silane compound, hydrolysis and condensation may be insufficient, and the resultant dielectric insulating film will not have good dielectric and mechanical properties. Otherwise, if the water content exceeds 30 moles per mole of hydrolysable functional groups of the silane compound, phase separation may occur during hydrolysis and condensation, thereby causing non-uniform reaction, and the coating property tends to become poor.

Water may be added incrementally or continuously. The catalyst may be mixed in the organic solvent in advance, or may be added after being dissolved or dispersed in water.

Preferably, the hydrolysis and condensation of the organosiloxane polymer are performed at 0 to 100° C.

The first metal ions may be added along with the organosiloxane polymer and the organic solvent included in a metal salt comprising Rb ions, Cs ions, or a mixture thereof.

The first metal ions are preferably comprised at 1 to 200 ppm, more preferably at 5 to 100 ppm, based on the weight of the coating composition for a dielectric insulating film. If the content of the first metal ions is below 1 ppm, facilitation of curing of the organosiloxane polymer, a matrix resin, is only slight, and thus mechanical strength, electric properties, and the dielectric property of the dielectric insulating film become poor. Otherwise, if it exceeds 200 ppm, no further property improvement is obtained and storage stability becomes poor, which may cause worsening of the dielectric and electric properties of the dielectric insulating film.

In the present invention, the content of the second metal ion should be as small as possible. Preferably, it is comprised at less than 0.5 ppm based on the weight of the composition. And, preferably, the content of $Na^+$ ions and $K^+$ ions is smaller than 0.1 ppm, and more preferably smaller than 0.02 ppm. If the content of the second metal ions exceeds 0.5 ppm, or if the content of $Na^+$ ions and $K^+$ ions exceeds 0.1 ppm, electric properties of the dielectric insulating film may be affected, and gate device characteristics may be fatally affected.

The second metal ions may be removed by a common metal ion removing method prior to the addition of the first metal ions. More specifically, the second metal ions may be washed off with water, or removed using an ion exchange resin filter or a zeta-potential filter, and so forth. However, these examples are not limiting examples.

The organic solvent comprised in the coating composition for a dielectric insulating film is not particularly limited. It may be the organic solvent used in the preparation of the organosiloxane polymer, a new organic solvent added after the preparation of the organosiloxane polymer, or a mixture of the two.

Preferable examples of the organic solvent are the same as the organic solvent used in the preparation of the organosiloxane polymer, and will not be specified here. However, among them, at least one ether solvent selected from the group consisting of ethylene glycol monomethyl ether, ethylene glycol dimethyl ether, ethylene glycol diethyl ether, propylene glycol monomethyl ether, and propylene glycol dimethyl ether, and at lest one ester solvent selected from the group consisting of diethyl carbonate, methyl acetate, ethyl acetate, ethyl lactate, ethylene glycol monomethyl ether acetate, propylene glycol monomethyl ether acetate, and ethylene glycol diacetate are more preferable for use as the main solvent, considering the coating properties of the coating composition.

When the organic solvent that has been used in the preparation of the organosiloxane polymer is used, it is preferable to remove specific organic solvents that impair coating properties of the coating composition, reaction byproducts produced during the preparation of the organosiloxane polymer, and water, to below a specific level.

The coating composition for a dielectric insulating film of the invention may further comprise d) a pore generating material, in order to reduce the density of the dielectric insulating film. Preferably, the pore generating material is any organic molecule, or an organic polymer that can be pyrolyzed at 450° C. or lower.

To take specific preferable examples, at least one organic molecule selected from the group consisting of an aliphatic hydrocarbon, an aromatic hydrocarbon, an ether compound, an ester compound, an anhydride compound, a carbonate compound, an acryl compound, a thioether compound, an isocyanate compound, an isocyanurate compound, a sulfone compound, and a sulfoxide compound that can be pyrolyzed at 150 to 450° C., or a polymer polymerized therefrom, and more preferably an alkylene oxide polymer and an acrylate polymer that can be pyrolyzed at 150 to 450° C., may be used.

The pore generating material may have an alkoxy silane functional group, at the terminal or inside the molecule that can react with the organosiloxane polymer.

Preferably, the pore generating material has a weight-average molecular weight of 300 to 100,000, more preferably 300 to 20,000. If the molecular weight of the pore generating material is smaller than 300, pore generation may be insufficient. Otherwise, if it exceeds 100,000, compatibility with the matrix resin becomes poor, and formation of micropores becomes difficult.

Preferably, the pore generating material is at least one selected from the group consisting of a polymer or a copolymer having a linear, block, radial, or crosslinkage type of molecular structure. More preferably, it is at least one selected from the group consisting of a polymer or a copolymer having a block, radial, or crosslinkage type of molecular structure.

The coating properties of the coating composition for a dielectric insulating film are controlled by the solid content in the composition. Preferably, the coating composition for a dielectric insulating film has a solid content of 2 to 60 wt %, and more preferably 5 to 40 wt %. If the solid content is below 2 wt %, a sufficient film thickness cannot be attained. Otherwise, if it exceeds 60 wt %, coating properties and storage stability become poor.

The coating composition for a dielectric insulating film may further comprise water for improvement of its mechanical strength and dielectric property. Preferably, the water is comprised at 1 to 10 wt %, and more preferably at 2 to 7 wt %, per 100 wt % of the composition. If the water content is below 1 wt %, improvement of the mechanical strength and dielectric property is only slight. Otherwise, if it exceeds 10 wt %, coating properties of the dielectric insulating film become poor, so that it is difficult to obtain a uniform dielectric insulating film.

The dielectric insulating film of the invention is prepared from the coating composition for a dielectric insulating film by coating the composition on a substrate, and curing the resultant film by drying and baking.

The substrate is not particularly limited, but a silicon wafer, a $SiO_2$ wafer, a SiN wafer, a compound semiconductor, a glass substrate, or a polymer substrate is preferable.

Coating of the composition on the substrate may be performed by conventional liquid phase coating, preferably by spin coating, dip coating, roll coating, or spray coating, and more preferably by spin coating, particularly when the dielectric insulating film is used between multilayer circuits of a semiconductor device.

Thickness of the coat film may be controlled by the viscosity of the composition. In the case of spin coating, the thickness may be controlled by adjusting the spinning rate of the spin coater.

After the composition is coated, an organosiloxane polymer dielectric insulating film having a three-dimensional structure may be formed by drying and baking.

Preferably, the drying is performed in the temperature range where the organic solvent included in the coating composition can evaporate, more preferably at 30 to 300° C. The drying process may be divided into pre-baking and soft-baking steps. In the pre-baking step, the organic solvent included in the dielectric insulating film is slowly evaporated, and in the soft-baking step, a specific amount of the functional groups of the organosiloxane polymer is cross-linked.

The baking process, which follows the drying process, is the last process of reacting any remaining functional groups of the organosiloxane polymer. The baking temperature may be determined considering thermal stability of the organosiloxane polymer dielectric insulating film, and characteristics of the semiconductor device prepared therefrom. Preferably, the baking is performed at 300° C. or above, and more preferably at 350 to 500° C.

The drying and baking may be performed either by increasing the temperature continuously, or by increasing the temperature incrementally. In the case of incremental drying and baking, drying and baking at each temperature is preferably performed for from 1 minute to 5 hours.

The method of heating in the drying and baking is not particularly limited. A hot plate, an oven, a furnace, etc., may be used for heating. The heating may be performed under an inert gas atmosphere, e.g., with nitrogen, argon, or helium, under an oxygen atmosphere, under an oxygen-containing gas atmosphere (e.g., air), in a vacuum, or under an ammonia- or hydrogen-containing gas atmosphere.

The same or different heating methods may be used during the drying and baking processes.

The dielectric insulating film prepared from the coating composition may comprise first metal ions selected from the group consisting of Rb ions, Cs ions, and a mixture thereof, or a salt thereof, which is added to facilitate curing of the organosiloxane polymer.

The first metal ions or the salt thereof facilitate curing of the organosiloxane polymer, thereby reducing unreacted functional groups in the dielectric insulating film, enhancing mechanical strength of the dielectric insulating film, and improving the dielectric and electric properties of the dielectric insulating film.

The content of the first metal ions or the salt thereof is determined by the content of the first metal ions comprised in the coating composition for a dielectric insulating film. Preferably, it is 5 to 1500 ppm, more preferably 15 to 800 ppm, based on the weight of the dielectric insulating film. If the content of the first metal ions is below 5 ppm, mechanical strength and electric properties of the dielectric insulating film may worsen. Otherwise, if it exceeds 1500 ppm, dielectric and electric properties of the dielectric insulating film may worsen.

Since the dielectric insulating film has a good dielectric property and superior mechanical and electric properties, it may be used as an inter-layer dielectric insulating film of a semiconductor device, an inter-layer dielectric insulating film of an electronic device, a protection film of an electronic device, an inter-layer dielectric insulating film of a multilayer wiring substrate, a protection film, or an anti-insulating film of a liquid crystal display device, gas barrier film, etc.

The thickness of the dielectric insulating film can vary depending on use, and is not particularly limited, but when it is used as an inter-layer dielectric insulating film of a semiconductor device, a thickness of 0.05 to 2 μm is preferable.

EXAMPLES

The following examples further illustrate the present invention in detail, but they are not to be construed as limiting the scope of the invention.

Example 1

Preparation of Coating Composition for a Dielectric Insulating Film 100.0 g of methyl trimethoxysilane (MTMS) and 83.8 g of tetramethoxysilane (TMS) were added to 429 g of tetrahydrofuran, an organic solvent. Then, 81.0 g of a 0.01 N aqueous nitric acid solution was slowly added thereto. Reaction was performed at room temperature (25° C.) for 30 minutes. After slowly heating to 80° C., reaction was performed overnight (24 hours) while heating and refluxing.

After the reaction was completed, the reaction solution was diluted with ether, and washed with water until a neutral pH obtained. Magnesium sulfate was added to completely remove water from the reaction solution, and then remaining solvent was completely removed in a vacuum oven to obtain an organosiloxane polymer. The organosiloxane polymer had a weight-average molecular weight of 3500.

The organosiloxane polymer was dissolved in propylene glycol methyl ether acetate to a 20 wt % solution. The solution was passed through a metal ion removal filter, so that the total metal ion content became 0.05 ppm or lower based on the weight of the solution. Metal ion content was measured with an inductively coupled plasma-mass spectrometer (ICP-MS). The results are given in Table 1 below.

TABLE 1

| | | | | Element | | | | (Unit: ppm) |
|---|---|---|---|---|---|---|---|---|
| | Cu | Fe | K | Na | Ca | Mg | Zn | Total |
| Content | 0.001 | 0.014 | 0.002 | 0.003 | 0.016 | 0.004 | 0.004 | 0.044 |

30 ppm of a RbCl salt based on the weight of the solution was added to the purified organosiloxane polymer solution, to obtain a coating composition for a dielectric insulating film.

(Preparation of Dielectric Insulating Film)

The resultant coating composition for a dielectric insulating film was spin coated on a silicon wafer to obtain a coat film, and dried by pre-baking on a hot plate at 80° C. for 1 minute, and then soft-baking at 150° C. for 1 minute.

The dried silicon wafer was heated to 430° C. in a furnace, and cured for 1 hour to obtain a dielectric insulating film.

Example 2

Preparation of Coating Composition for a Dielectric Insulating Film

An organosiloxane polymer obtained in the same manner as in Example 1 was dissolved in propylene glycol methyl ether acetate to a concentration of 20 wt % to obtain an organosiloxane polymer solution.

And, a polyethylene oxide (PEO)-polypropylene oxide (PPO)-polyethylene oxide (PEO) copolymer (triblock copolymer) having a weight-average molecular weight of 5,000 and a polyethylene oxide content of 30% was dissolved in propylene glycol methyl ether acetate to a concentration of 20 wt % to obtain a PEO-PPO-PEO solution.

A mixture of 1.1 g of water and 7.6 g of the PEO-PPO-PEO solution was added to 20 g of the prepared organosiloxane polymer solution. The mixture solution was passed through a metal ion removal filter, so that the total metal ion content became 0.05 ppm or lower based on the weight of the solution.

30 ppm of a RbCl salt based on the weight of the solution was added to the purified polymer solution to obtain a coating composition for a dielectric insulating film.

(Preparation of Dielectric Insulating Film)

A dielectric insulating film was prepared in the same manner as in Example 1.

Example 3

Preparation of Coating Composition for a Dielectric Insulating Film

A coating composition for a dielectric insulating film was prepared in the same manner as in Example 2, except that 100 ppm of a RbCl salt based on the mixture solution purified using a metal ion removal filter was added to the solution.

(Preparation of Dielectric Insulating Film)

A dielectric insulating film was prepared in the same manner as in Example 1.

Example 4

Preparation of Coating Composition for a Dielectric Insulating Film

A coating composition for a dielectric insulating film was prepared in the same manner as in Example 2, except that 100 ppm of a CsCl salt based on the mixture solution purified using a metal ion removal filter was added to the solution.

(Preparation of Dielectric Insulating Film)

A dielectric insulating film was prepared in the same manner as in Example 1.

Example 5

Preparation of Coating Composition for a Dielectric Insulating Film

A coating composition for a dielectric insulating film was prepared in the same manner as in Example 2, except that 50 ppm of a RbCl salt and 50 ppm of a CsCl salt based on the mixture solution purified using a metal ion removal filter was added to the solution.

(Preparation of Dielectric Insulating Film)

A dielectric insulating film was prepared in the same manner as in Example 1.

Comparative Example 1

Preparation of Coating Composition for a Dielectric Insulating Film

A coating composition for a dielectric insulating film was prepared in the same manner as in Example 1, except that a RbCl salt was not added after purification using a metal ion removal filter.

(Preparation of Dielectric Insulating Film)

A dielectric insulating film was prepared in the same manner as in Example 1.

Comparative Example 2

Preparation of Coating Composition for a Dielectric Insulating Film

A coating composition for a dielectric insulating film was prepared in the same manner as in Example 2, except that a RbCl salt was not added after purification using a metal ion removal filter.

(Preparation of Dielectric Insulating Film)

A dielectric insulating film was prepared in the same manner as in Example 1.

Comparative Example 3

Preparation of Coating Composition for a Dielectric Insulating Film

A coating composition for a dielectric insulating film was prepared in the same manner as in Example 2, except that 0.2 ppm of a RbCl salt based on the mixture solution purified using a metal ion removal filter was added to the solution.

(Preparation of Dielectric Insulating Film)

A dielectric insulating film was prepared in the same manner as in Example 1.

Comparative Example 4

Preparation of Coating. Composition for a Dielectric Insulating Film

A coating composition for a dielectric insulating film was prepared in the same manner as in Example 2, except that 100 ppm of a $ZnCl_2$ salt based on the mixture solution purified using a metal ion removal filter was added to the solution instead of the RbCl salt.

(Preparation of Dielectric Insulating Film)

A dielectric insulating film was prepared in the same manner as in Example 1.

Comparative Example 5

Preparation of Coating Composition for a Dielectric Insulating Film

A coating composition for a dielectric insulating film was prepared in the same manner as in Example 2, except that 100 ppm of a $SnCl_2$ salt based on the mixture solution purified using a metal ion removal filter was added to the solution instead of the RbCl salt.

(Preparation of Dielectric Insulating Film)

A dielectric insulating film was prepared in the same manner as in Example 1.

Comparative Example 6

Preparation of Coating Composition for a Dielectric Insulating Film

A coating composition for a dielectric insulating film was prepared in the same manner as in Example 2, except that 100 ppm of a $PtCl_2$ salt based on the mixture solution purified using a metal ion removal filter was added to the solution instead of the RbCl salt.

(Preparation of Dielectric Insulating Film)

A dielectric insulating film was prepared in the same manner as in Example 1.

Comparative Example 7

Preparation of Coating Composition for a Dielectric Insulating Film

A coating composition for a dielectric insulating film was prepared in the same manner as in Example 2, except that 100 ppm of a FeCl₃ salt based on the mixture solution purified using a metal ion removal filter was added to the solution instead of the RbCl salt.

(Preparation of Dielectric Insulating Film)

A dielectric insulating film was prepared in the same manner as in Example 1.

Comparative Example 8

Preparation of Coating Composition for a Dielectric Insulating Film

A coating composition for a dielectric insulating film was prepared in the same manner as in Example 2, except that 100 ppm of a NiCl₂ salt based on the mixture solution purified using a metal ion removal filter was added to the solution instead of the RbCl salt.

(Preparation of Dielectric Insulating Film)

A dielectric insulating film was prepared in the same manner as in Example 1.

Comparative Example 9

Preparation of Coating Composition for a Dielectric Insulating Film

A coating composition for a dielectric insulating film was prepared in the same manner as in Example 2, except that 500 ppm of a RbCl salt based on the mixture solution purified using a metal ion removal filter was added to the solution.

(Preparation of Dielectric Insulating Film)

A dielectric insulating film was prepared in the same manner as in Example 1. RbCl salt was deposited on the surface of the dielectric insulating film, and it was impossible to obtain a uniform coat film.

Comparative Example 10

Preparation of Coating Composition for a Dielectric Insulating Film

A coating composition for a dielectric insulating film was prepared in the same manner as in Example 2, except that 100 ppm of a tetramethylammonium nitrate salt based on the mixture solution purified using a metal ion removal filter was added to the solution. When stored at room temperature for 1 week, the viscosity of the solution dropped rapidly.

(Preparation of Dielectric Insulating Film)

A dielectric insulating film was prepared in the same manner as in Example 1.

[Measurement of Physical Properties of Dielectric Insulating Film]

The dielectric constant, mechanical strength, and leakage current were measured for the dielectric insulating films prepared in Examples 1 to 5, and Comparative Examples 1 to 10. Measurements were made as follows.

Dielectric Constant

An MIS (metal/insulator/semiconductor) device comprising each of the dielectric insulating films prepared in Examples 1 to 5 and Comparative Examples 1 to 10 was manufactured on a P-doped Si wafer. Measurements were made at 1 MHz using an LCR meter (HP).

Mechanical Strength

Modulus and hardness were measured using a Nano Indenter.

Breakdown Voltage and Leakage Current)

An MIS (metal/insulator/semiconductor) device comprising each of the dielectric insulating films prepared in Examples 1 to 5 and Comparative Examples 1 to 10 was manufactured on a P-doped Si wafer. Breakdown voltage and leakage current were measured using a Keithley 6517 electrometer.

Measurement results are shown in Table 2 below.

TABLE 2

| | Added materials | Dielectric constant | Modulus (GPa) | Hardness (GPa) | Breakdown voltage (MV/cm) | Leakage current @ 1 MV/cm (A/cm²) |
|---|---|---|---|---|---|---|
| Example 1 | 30 ppm RbCl | 2.89 | 14.5 | 1.61 | 5.0 | $10^{-10}$ |
| Example 2 | 30 ppm RbCl, PEO-PPO-PEO | 2.20 | 5.30 | 0.61 | 3.4 | $10^{-9}$ |
| Example 3 | 100 ppm RbCl, PEO-PPO-PEO | 2.18 | 5.89 | 0.65 | 3.6 | $<10^{-9}$ |
| Example 4 | 100 ppm CsCl, PEO-PPO-PEO | 2.20 | 5.59 | 0.62 | 3.9 | $<10^{-9}$ |
| Example 5 | 50 ppm RbCl + 50 ppm CsCl, PEO-PPO-PEO | 2.20 | 5.75 | 0.63 | 3.7 | $<10^{-9}$ |
| Comparative Example 1 | — | 3.23 | 11.8 | 1.31 | 4.5 | $10^{-7}$ |
| Comparative Example 2 | PEO-PPO-PEO | 2.72 | 4.14 | 0.46 | 2.9 | $10^{-5}$ |
| Comparative Example 3 | 0.2 ppm RbCl, PEO-PPO-PEO | 2.70 | 4.20 | 0.47 | 3.0 | $10^{-6}$ |
| Comparative Example 4 | 100 ppm ZnCl₂, PEO-PPO-PEO | 2.80 | 3.70 | 0.39 | 2.5 | $>10^{-5}$ |
| Comparative Example 5 | 100 ppm SnCl₂, PEO-PPO-PEO | 3.03 | 3.75 | 0.41 | 2.2 | $>10^{-5}$ |
| Comparative Example 6 | 100 ppm PtCl₂, PEO-PPO-PEO | 2.60 | 4.44 | 0.54 | 2.9 | $10^{-6}$ |

TABLE 2-continued

| | Added materials | Dielectric constant | Modulus (GPa) | Hardness (GPa) | Breakdown voltage (MV/cm) | Leakage current @ 1 MV/cm (A/cm²) |
|---|---|---|---|---|---|---|
| Comparative Example 7 | 100 ppm FeCl₃, PEO-PPO-PEO | 3.21 | 4.12 | 0.43 | 2.0 | >10⁻⁵ |
| Comparative Example 8 | 100 ppm NiCl₂, PEO-PPO-PEO | 2.73 | 4.34 | 0.54 | 2.6 | 10⁻⁵ |
| Comparative Example 9 | 500 ppm RbCl, PEO-PPO-PEO | 2.34 | 5.60 | 0.62 | 3.1 | 10⁻⁷ |
| Comparative Example 10 | 100 ppm Me₄NNO₃, PEO-PPO-PEO | 2.45 | 3.91 | 0.43 | 3.0 | 10⁻⁷ |

As seen in Table 2, the dielectric insulating films prepared from the coating compositions comprising Rb ions or CS ions, i.e., the first metal ions (Examples 1 to 5), had lower dielectric constants and improved mechanical strength and electric properties compared with other dielectric insulating films not comprising the metal ions.

The dielectric constant and mechanical properties of the dielectric insulating films of Comparative Examples 4 to 8, which comprised the metal ions other than the Rb ions or CS ions, i.e., the second metal ions, were not improved. The dielectric insulating film of Comparative Example 10, which was prepared from the coating composition comprising an amine (ammonium salt), which is known to facilitate curing, had poor storage stability and mechanical strength, and the electrical and dielectric properties were not good.

While the present invention has been described in detail with reference to the preferred embodiments, those skilled in the art will appreciate that various modifications and substitutions can be made thereto without departing from the spirit and scope of the invention as set forth in the appended claims.

What is claimed is:

1. A method of preparation for a dielectric insulating film comprising the steps of:
   a) dissolving an organosiloxane polymer in an organic solvent;
   b) regulating the content of second metal ions to be 0.5 ppm or lower where the second metal ions are at least one selected from the group consisting of Na, K, Ca, Fe, Cu, Ni, Mg, and Zn;
   c) regulating the content of first metal ions to be 1 to 200 ppm based on the weight of a coating composition, where the first metal ions are at least one selected from the group consisting of Rb ions, Cs ions, and a mixture thereof to obtain a coating composition; and
   d) manufacturing the dielectric insulating film from the coating composition,
   wherein regulating the content of the second metal ions comprises removing the second metal ions by washing with water, or by using an ion exchange resin filter or a zeta-potential filter.

2. The method of preparation for a dielectric insulating film of claim 1, wherein the organosiloxane polymer is polymerized from at least one silane compound selected from the group consisting of:
   a) at least one monomer selected from the group consisting of the compounds represented by Formula 1 and Formula 2 below;
   b) a dimer prepared from the monomer; and
   c) an oligomer prepared from the monomer, the dimer, or a mixture thereof, $$SiR^1_p R^2_{4-p} \quad (1),$$

where
$R^1$ is hydrogen, an aryl, a vinyl, an allyl, a $C_1$-$C_4$ linear or branched alkyl substituted with fluorine, or a $C_1$-$C_4$ linear or branched alkyl not substituted with fluorine,
$R^2$ is a linear or branched $C_1$-$C_4$ alkoxy, acetoxy, or chlorine, and
p is an integer of 1 to 2, and $$R^3_q R^4_{3-q} Si\text{-}M\text{-}SiR^5_r R^6_{3-r} \quad (2),$$

Where
each of $R^3$ and $R^5$ is, independently, hydrogen, a fluorine, an aryl, a vinyl, an allyl, a $C_1$-$C_4$ linear or branched alkyl substituted with fluorine, or a $C_1$-$C_4$ linear or branched alkyl not substituted with fluorine, each of $R^4$ and $R^6$ is, independently, a $C_1$-$C_4$ linear or branched alkoxy, acetoxy, or chlorine;
M is a $C_1$-$C_6$ alkylene, or a phenylene; and
each of q and r is an integer of 0 to 2.

3. The method of preparation for a dielectric insulating film of claim 1, wherein the total content of Na ions and K ions is 0.1 ppm or smaller.

4. The method of preparation for a dielectric insulating film of claim 1, wherein the organic solvent is at least one selected from the group consisting of:
   a) at least one aliphatic hydrocarbon solvent selected from the group consisting of n-pentane, i-pentane, n-hexane, i-hexane, 2,2,4-trimethylpentane, cyclohexane, and methylcyclohexane;
   b) at least one aromatic hydrocarbon solvent selected from the group consisting of benzene, toluene, xylene, trimethylbenzene, ethylbenzene, and methyl ethylbenzene;
   c) at least one alcohol solvent selected from the group consisting of methyl alcohol, ethyl alcohol, n-propanol, i-propanol, n-butanol, i-butanol, sec-butanol, t-butanol, 4-methyl 2-pentanol, cyclohexanol, methylcyclohexanol, and glycerol;
   d) at least one ketone solvent selected from the group consisting of methyl ethyl ketone, methyl isobutyl ketone, diethyl ketone, methyl n-propyl ketone, methyl n-butyl ketone, cyclohexanone, methylcyclohexanone, and acetylacetone;
   e) at least one ether solvent selected from the group consisting of tetrahydrofuran, 2-methyltetrahydrofuran, ethyl ether, n-propyl ether, isopropyl ether, diglyme, dioxin, dimethyldioxin, ethylene glycol monomethyl ether, ethylene glycol dimethyl ether, ethylene glycol diethyl ether, propylene glycol monomethyl ether, and propylene glycol dimethyl ether;

f) at least one ester solvent selected from the group consisting of diethyl carbonate, methyl acetate, ethyl acetate, ethyl lactate, ethylene glycol monomethyl ether acetate, propylene glycol monomethyl ether acetate, and ethylene glycol diacetate; and g) at least one amide solvent selected from the group consisting of N-methylpyrrolidone, formamide, N-methylformamide, N-ethylformamide, N,N-dimethylacetamide, and N,N-diethylacetamide.

5. The method of preparation for a dielectric insulating film of claim 1, wherein the coating composition further comprises d) a pore generating material.

6. The method of preparation for a dielectric insulating film of claim 5, wherein the pore generating material is at least one organic molecule selected from the group consisting of an aliphatic hydrocarbon, an aromatic hydrocarbon, an ether compound, an ester compound, an anhydride compound, a carbonate compound, an acryl compound, a thioether compound, an isocyanate compound, an isocyanurate compound, a sulfone compound, and a sulfoxide compound that can be pyrolyzed in the temperature range of 150 to 450° C., and a polymer polymerized therefrom.

7. The method of preparation for a dielectric insulating film of claim 6, wherein the pore generating material is a linear polymer, a block copolymer, a radial polymer, or a crosslinking polymer which has a weight-average molecular weight of 300 to 100,000.

8. The method of preparation for a dielectric insulating film of claim 1, wherein a solid content of the coating composition is 2 to 60 wt %.

9. The method of preparation for a dielectric insulating film of claim 1, wherein the coating composition further comprises e) water.

10. The method of preparation for a dielectric insulating film of claim 1, wherein the dielectric insulating film comprises 5 to 1500 ppm of the first metal ions based on the weight of the dielectric insulating film.

* * * * *